US006238481B1

(12) United States Patent
Yamashita et al.

(10) Patent No.: US 6,238,481 B1
(45) Date of Patent: May 29, 2001

(54) METHOD OF MANUFACTURING ULTRASONIC PROBE AND ULTRASONIC DIAGNOSTIC APPARATUS

(75) Inventors: Yohachi Yamashita, Yokohama; Tsuyoshi Kobayashi; Shiroh Saitoh, both of Kawasaki; Kouichi Harada, Tokyo; Senji Shimanuki, Atsugi, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/321,549

(22) Filed: May 28, 1999

(51) Int. Cl.[7] .................................................... C30B 25/02
(52) U.S. Cl. ................................................................ 117/84
(58) Field of Search ......................... 117/84; 128/662.08; 310/334

(56) References Cited

U.S. PATENT DOCUMENTS

| | | | |
|---|---|---|---|
| 5,295,487 | 3/1994 | Saitoh et al. | 128/662.08 |
| 5,402,791 | 4/1995 | Saitoh et al. | 128/662.08 |
| 5,410,209 | 4/1995 | Yamashita et al. | 310/334 |
| 6,020,675 * | 2/2000 | Yamashita et al. | 310/358 |

OTHER PUBLICATIONS

Shiroh Saitoh, et al., "Forty–Channel Phased Array Ultrasonic Probe Using $0.91Pb(Zn_{1/3}Nb_{2/3})$ $O_3$–$0.09PbTiO_3$ Single Crystal", IEEE Transactions on Ultrasonics, Ferroelectrics, and Frequency Control, vol. 46, No. 1, Jan. 1999, pp. 152–157.

Shiroh Saitoh, et al., "A 3.7 MHz Phased Array Probe Using 0.91 $Pb(Zn_{1/3}Nb_{2/3})O_3$–$0.09PbTiO_3$ Single Crystal", IEEE Transactions on Ultrasonics, Ferroelectrics, and Frequency Control, vol. 46, No. 2, Mar. 1999, pp. 414–421.

* cited by examiner

*Primary Examiner*—Felisa Hiteshew
(74) *Attorney, Agent, or Firm*—Oblon, Spivak, McClelland, Maier & Neustadt, P.C.

(57) ABSTRACT

A method of manufacturing an ultrasonic probe includes the steps of forming electrodes on two surfaces of a piezoelectric single crystal made of a complex perovskite compound and then adhering the piezoelectric single crystal on a backing material, dicing the piezoelectric single crystal to form an arrayed piezoelectric single-crystal transducer, and poling the arrayed piezoelectric single-crystal transducer in the electric field of 0.5 to 2 kV/mm at a temperature of 80° C. or less.

28 Claims, 2 Drawing Sheets

METHOD OF MANUFACTURING ULTRASONIC PROBE AND ULTRASONIC DIAGNOSTIC APPARATUS

BACKGROUND OF THE INVENTION

The present invention relates to a method of manufacturing an ultrasonic probe and, more particularly, to a method of manufacturing an array ultrasonic probe used in a medical diagnostic apparatus.

In the fields of medical diagnostic apparatuses for examining body cavities and nondestructive inspection apparatuses for probing the interiors of metal welded portions, ultrasonic imaging apparatuses have been used. In such an apparatus, an ultrasonic probe transmits and receives an ultrasonic wave to image the internal state of an object to be examined. The ultrasonic probe of an apparatus of this type uses an ultrasonic transducer made of a piezoelectric ceramic.

Lead zirconium titanate (PZT) has conventionally been used as an ultrasonic probe piezoelectric ceramic. The PZT characteristics such as an electromechanical coupling factor have improved little for the past 20 years. Therefore, a new material has been sought for.

In recent years, a piezoelectric single crystal as a solid solution of lead titanate (PT) and various kind of complex perovskite compound (to be generally called a relaxor) has received a great deal of attention because it has a large electromechanical coupling factor. Known examples of the relaxor are lead-magnesium niobate (PMN) $Pb(Mg_{1/3}Nb_{2/3})O_3$, $Pb(In_{1/2}Nb_{1/2})O_3$, etc.

The piezoelectric single crystal consisting of a complex perovskite compound containing PT and a relaxor is generally represented as:

$$Pb[(B1B2)_{1-x}Ti_x]O_3$$

wherein B1 is at least one element selected from the group consisting of Mg, Sc, Ni, In, and Yb, and B2 is at least one element selected from the group consisting of Nb and Ta. This piezoelectric single crystal material contains 0 to 55 mol % of lead titanate. That is, $0<x\leqq 0.55$.

Such a piezoelectric single crystal allows use of a thin transducer even in low-frequency conditions and has a high sensitivity. The thin transducer requires only a small cutting depth for the diamond wheel blade of a dicing machine in obtaining sliver transducers. Even a thin blade can cut the piezoelectric single crystal vertically to improve the yield and provide an ultrasonic probe having a reduced side lobe. Such a piezoelectric single crystal has a relative dielectric constant equal to or higher than that of a conventional PZT piezoelectric ceramic and is thus excellent in matching with a transmitter/receiver. A high-sensitivity signal, in which the loss by the capacitances of a cable and apparatus is small, can be obtained. The acoustic impedance of such a single crystal is as low as about 65% of ceramics and near to the human body, thus facilitating acoustic impedance matching.

Due to the above advantages, an ultrasonic probe using an ultrasonic transducer made of the above piezoelectric single crystal has a higher signal sensitivity by about 5 dB or more than an ultrasonic probe using the conventional PZT piezoelectric ceramic. Human tomographic images (B mode images) obtained with this ultrasonic probe allow the operator to clearly observe a small change to a morbid state or a deep human tissue.

When an ultrasonic probe using an ultrasonic transducer made of the above piezoelectric single crystal is applied to color flow mapping (CFM) for performing two-dimensional color display of an ultrasonic Doppler shift by a blood flow, a large signal can be obtained from an echo reflected by a small blood cell several μm in diameter.

The piezoelectric single crysta 1 represented by $Pb[(B1B2)_{1-x}Ti_x]O_3$ described above is not polarized in a specific direction after crystal growth. After electrodes are formed on both surfaces of the single crystal, it must undergo poling by applying a voltage to the electrode at a high temperature. Conventionally, poling was performed in an electric field of 1 to 3 kV/mm at a high temperature of about 200° C.

A cardiac probe transducer for an ultrasonic diagnostic apparatus has a standard size of about 15 mm×25 mm and an area of more than 2.0 $cm^2$. When a thin single-crystal transducer having a large area undergoes poling under the above conditions, a large warpage of 1 mm or more may occur in the transducer. When the warped transducer is diced after an acoustic matching layer and backing material are adhered to the upper and lower surfaces of the transducer, cracking readily occurs in the transducer, and the production yield greatly decreases. When an array transducer is formed at a dicing pitch of 200 μm or less, the electrical properties of the respective transducers greatly vary.

BRIEF SUMMARY OF THE INVENTION

It is an object of the present invention to provide a method of stably manufacturing an array ultrasonic probe having uniform characteristics at a high yield by using a piezoelectric single-crystal transducer made of a perovskite compound.

A method of manufacturing an ultrasonic probe according to the present invention comprises the steps of adhering a piezoelectric single crystal made of a perovskite compound on a support substrate, dicing the piezoelectric single crystal in the form of an array to form a piezoelectric single-crystal transducer, and performing poling for the piezoelectric single-crystal transducer.

The present invention also provides a method of manufacturing an ultrasonic diagnostic apparatus comprising an ultrasonic probe, a transmitter/receiver and a signal processing unit connected to the ultrasonic probe, and a monitor for displaying a processed signal as an image. According to this method, the ultrasonic probe is formed by the steps of adhering a piezoelectric single crystal made of a perovskite compound on a backing material, dicing the piezoelectric single crystal in the form of an array to form a piezoelectric single-crystal transducer, and performing poling for the piezoelectric single-crystal transducer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention will now be described in more detail below.

Figure 1:
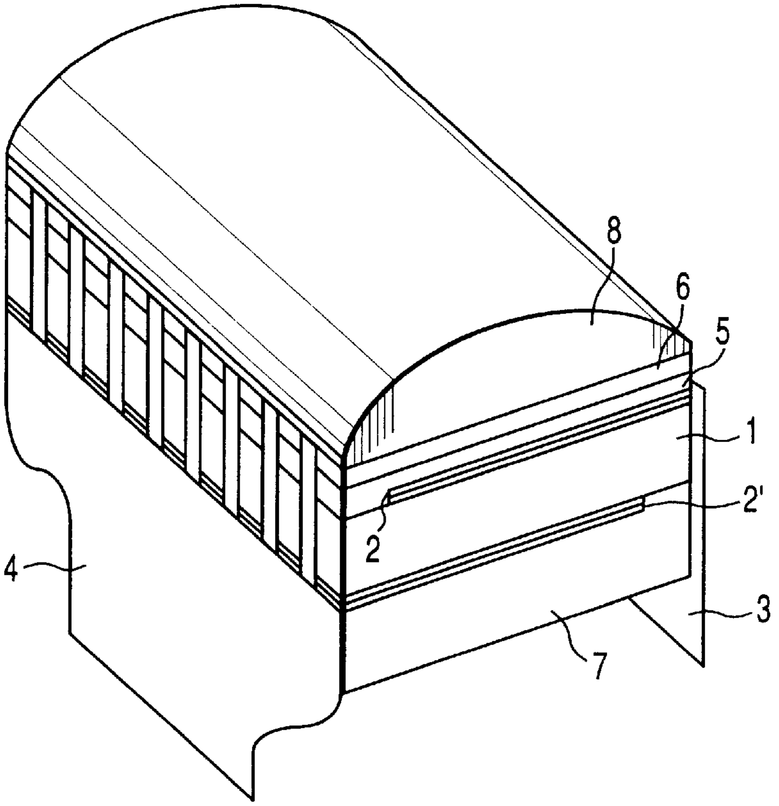
FIG. 1 is a perspective view showing an ultrasonic probe according to the present invention.

An ultrasonic probe according to the present invention will be described with reference to FIG. 1. Referring to FIG. 1, electrodes 2 and 2' are formed on the upper (ultrasonic transmission surface) and lower surfaces of an ultrasonic transducer 1. A common electrode plate 3 is connected to the electrode 2 on the upper surface, and a flexible printed circuit board 4 is connected to the electrode 2' on the lower surface. Acoustic matching layers 5 and 6 constituting a two-layered structure are adhered to the electrode 2 on the upper surface. A backing material 7 is adhered to the lower electrode 2' on the lower surface. In this state, the resultant structure is diced from the acoustic matching layer 6 side. The ultrasonic transducer 1 is completely cut. An acoustic lens 8 is adhered on the acoustic matching layer 6.

More specifically, the ultrasonic probe according to the present invention is manufactured through single-crystal growth, wafer process, formation of a rectangular transducer, first poling (if desired), connection of a flexible printed circuit board, formation of acoustic matching layers, adhesion to a backing material, dicing, second poling, and adhesion of an acoustic lens.

An example of a perovskite compound constituting a piezoelectric single crystal used in the present invention is represented by the following formula:

$$Pb\{(B1_{1/3},B2_{2/3})_{1-x}Ti_x\}O_3$$

where $0<x\leqq 0.55$, B1 is at least one element selected from the group consisting of Mg and Ni, and B2 is at least one element selected from the group consisting of Nb and Ta, or $$Pb\{(B1_{1/2},B2_{1/2})_{1-x}Ti_x\}O_3$$

where $0<x\leqq 0.55$, B1 is at least one element selected from the group consisting of In, Sc, and Yb, and B2 is at least one element selected from the group consisting of Nb and Ta.

In the above formula, x is set to 0.55 or less due to the following reason. If x exceeds 0.55, the electrical resistivity of the resultant piezoelectric single crystal decreases to make poling difficult at high voltages. In addition, the single crystal readily cracks due to poling. The piezoelectric single crystal represented by the above formula exhibit better piezoelectric characteristics than those of the PZT ceramic.

Deviation of the ratio of the B1 element to the B2 element from the stoichiometric ratio (1:1 or 1:2) is generally about ±0.02. Deviation of up to about ±0.2 is allowed.

A portion of Pb in the complex perovskite compound described above may be substituted by at least one element selected from the group consisting of Ba, Sr, Ca, and La. The substitution content is 10 mol % or less of Pb, and more preferably 5 mol % or less. If the substituting element exceeds 10 mol %, the growth rate of the single crystal becomes very low.

The above complex perovskite compound may contain a small amount of a transition metal such as Mn, Co, Fe, Sb, W, Cu and Hf, or a lanthanide element, or an alkali metal. The content of these elements is preferably 1 mol % or less. If the content exceeds 1 mol %, the resultant single crystal cannot keep a large piezoelectric constant.

The above complex perovskite compound may contain 5 mol % or less of $ZrO_2$. If the content of $ZrO_2$ exceeds 5 mol %, the growth rate of the single crystal extremely decreases, and variations in composition in the single crystal increase.

Examples of the single-crystal growth method according to the present invention are Bridgman method, flux method, Kyropoulous' method, zone melting method, hydrothermal growth method, solid state epitaxy, and thin-film forming method such as CVD.

An example of manufacturing a single crystal by the solution Bridgman method will be described below. Chemically highly pure PbO, MgO, $Sc_2O_3$, $In_2O_3$, $Ta_2O_5$, NiO, $Nb_2O_5$, and $TiO_2$ powders are used as starting materials. These powders are mixed to have the composition represented by the following formula:

$$Pb[(B1B2)_{1-x}Ti_x]O_3$$

PbO—$B_2O_3$ flux is added to the powder mixture, as needed. The resultant powder mixture is sufficiently mixed by a dry mixer and pressed in a rubber bag.

The mass obtained by this rubber press is placed in a platinum crucible, and a lid is placed on the crucible. The crucible is then held at the center of an electric furnace and heated to melt the material powder mixture. The molten material is gradually cooled to about 800° C. at a rate of about 1° C./h to grow a single crystal while the platinum crucible is moved downward at a rate of 0.1 to 1 mm/h. During cooling, oxygen is locally blown to one point at the lower portion of the platinum crucible to cause nucleation only at this single point. The platinum crucible is then stripped off to obtain the single crystal.

A method of manufacturing an ultrasonic probe will be described with reference to FIGS. 2A to 2D.

Figure 2A:
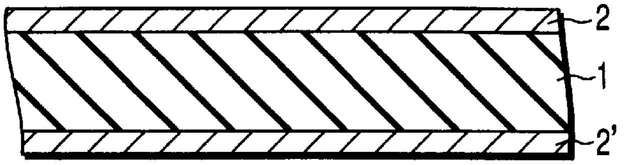
FIGS. 2A to 2D are sectional views showing the steps in manufacturing the ultrasonic probe shown in FIG. 1.

The resultant solid solution-based single crystal is observed with a Laue camera and cut in an arbitrary direction to prepare a wafer. For example, the single crystal is cut along a direction parallel to the [001] axis (or c-axis). At this time, the crystal orientation is determined in accordance with desired characteristics to be described later. A rectangular transducer having an area of 1.0 $cm^2$ or more, and preferably 2.0 $cm^2$ or more is cut from the prepared wafer. The resultant transducer 1 is polished to have a thickness of 0.6 mm or less, and preferably 0.5 mm or less. As shown in FIG. 2A, Ti/Au electrodes 2 and 2' each having a thickness of 0.02 to 1.0 $\mu$m are formed on the two surfaces of the transducer 1 by sputtering.

The transducer is then heated to 250° C. or less, e.g., 200° C., and an electric field of 0.5 kV/mm or less is applied to the transducer. While this electric field is kept applied, the transducer is cooled to room temperature to perform poling (first poling). This first poling may not necessarily be performed. When the electric field exceeds 0.5 kV/mm, the single crystal undesirably warps. The first poling may be performed before the step of adhering the piezoelectric single crystal on the support substrate (backing material) or immediately before the dicing step.

Figure 2B:
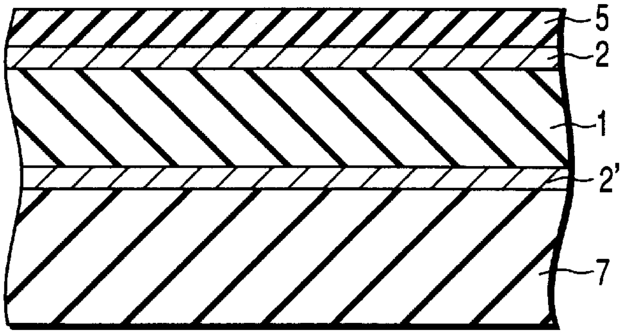

A common electrode plate (not depicted in FIG. 2B) is connected to the electrode 2 on the upper surface (ultrasonic transmission surface) of the transducer 1, and a flexible printed circuit board (not depicted in FIG. 2B) is connected to the electrode 2' on the lower surface of the transducer 1. As shown in FIG. 2B, an acoustic matching layer 5 is formed on the upper surface side of the transducer 1. The lower surface of the electrode 2' is adhered to a backing material 7. According to the method of the present invention, the transducer rarely warps, and cracking does not occur in the transducer in the adhering step.

Figure 2C:
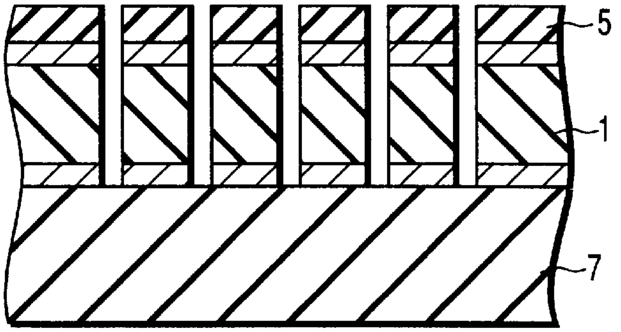

As shown in FIG. 2C, a dicer is used to dice the acoustic matching layer 5, the upper electrode 2, the transducer 1, and the lower electrode 2' at a predetermined dicing pitch.

According to the feature of the manufacturing method of the present invention, poling (second poling) is performed after dicing the transducer. This second poling is performed at a temperature of room temperature to 80° C. for 0.2 to 5 min while an electric field of 0.5 to 2 kV/mm is kept applied to the transducer. When the second poling is performed at a temperature exceeding 80° C., other constituent components such as backing material and acoustic matching layers are adversely affected. According to the present invention, poling is performed under the above conditions after dicing, and an array ultrasonic probe having uniform characteristics can be manufactured at a high yield.

Figure 2D:
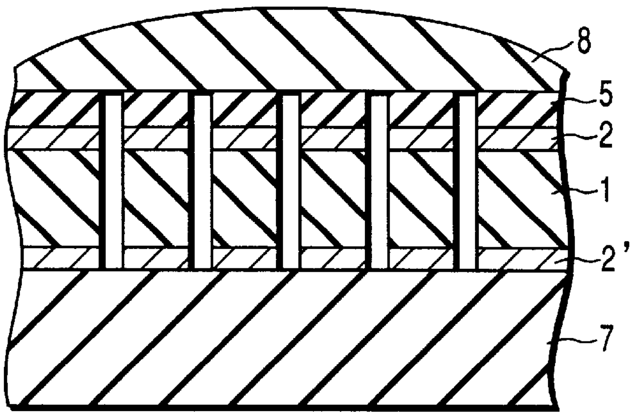

As shown in FIG. 2D, an acoustic lens 8 is adhered to the upper surface side of the transducer 1. A coaxial cable is then connected to the flexible printed circuit board 4 to prepare an array probe. This array probe operates at a frequency of 0.5 to 20 MHz.

The crystal orientation in cutting the wafer and the characteristics of the resultant transducer will be described below. For example, a single crystal is cut perpendicularly to the [001] axis (or c-axis), electrodes are formed on the (001) surfaces, and poling is performed. In this case, a transducer with a large electromechanical coupling factor can be obtained. Alternatively, a single crystal is cut perpendicularly to the [111] axis, electrodes are formed on the (111) surfaces, and poling is performed. In this case, a single crystal having a high dielectric constant can be obtained. A single crystal is cut parallel to the [111] axis, electrodes are formed on the (111) surfaces, and poling is performed. In this case, a transducer having a high dielectric constant of about 200 to 8,000 can be obtained. In particular, electrical impedance matching between each small transducer and cable can be facilitated.

When a transducer obtained by cutting a single crystal parallel to the [001] axis (or c-axis) is processed in the form of an array, the sound velocity is 2,000 to 3,500 m/s in the direction of thickness ([001] axis), and the frequency constant as the product of anti-resonance frequency and thickness is 1,200 to 1,800 Hz·m. By contrast, in the PZT piezoelectric ceramic, the sound velocity in the direction of thickness is higher than that of the single crystal by about 20 to 30%, and the frequency constant is 1,800 to 2,200 Hz·m. For example, a rectangular transducer of 15 mm×0.2 mm×0.4 mm made of a single crystal has a large electromechanical coupling factor $k_{33}$' of 78% to 85% and little variations. The method of the present invention can also manufacture an array probe having a maximum length of about 100 mm and as many as 400 channels of high-performance transducers.

Figure 3:
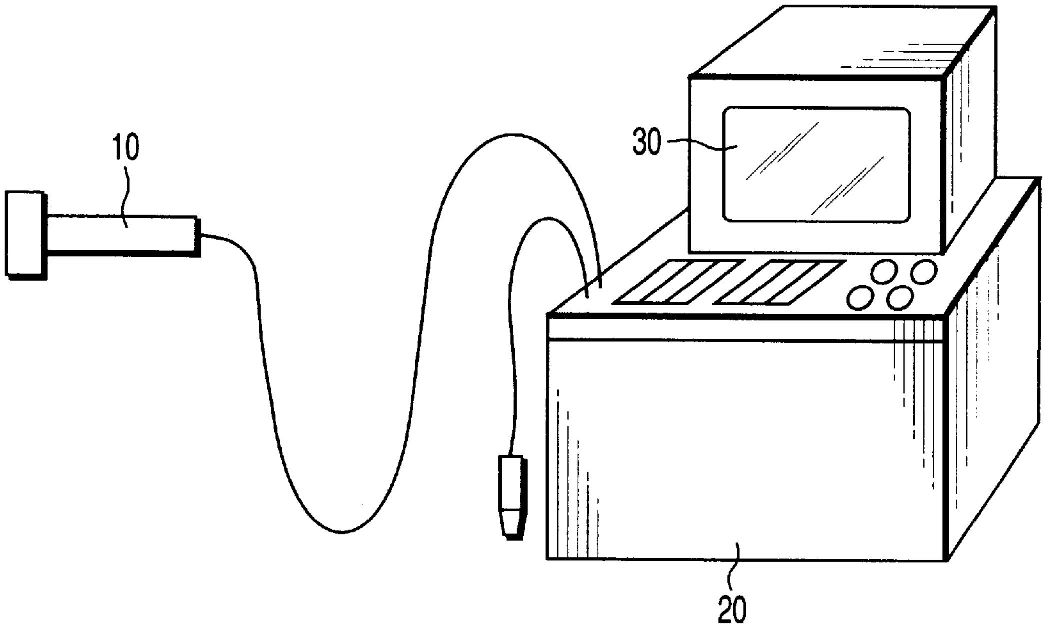
FIG. 3 is a schematic view of an ultrasonic diagnostic apparatus according to the present invention.

The ultrasonic probe of the present invention can be applied to an ultrasonic diagnostic apparatus, as shown in FIG. 3. The flexible printed circuit board and common electrode plate of an ultrasonic probe 10 having a probe head as shown in FIG. 1 are connected to a transmitter/receiver and a signal processing unit 20 via a coaxial cable. The signal processed in the signal processing unit 20 is displayed on a monitor 30 as an image.

In the ultrasonic diagnostic apparatus shown in FIG. 3, the transmitter/receiver and the signal processing unit 20 and the monitor 30 are assembled together to form a console. In addition, the ultrasonic probe 10, the signal processing unit 20 and the monitor 30 are connected via cables. However, various modifications may be made with respect to the ultrasonic diagnostic apparatus according to the present invention. For example, a part or the whole of the signal processing unit 20 may be miniaturized and integrated with the ultrasonic probe 10. The monitor 30 may be separated from the signal processing unit 20. Further, signals may be transmitted and received by wireless among the ultrasonic probe 10, the signal processing unit 20 and the monitor 30.

The ultrasonic probe of the present invention is also applicable to an ultrasonic lithotripsy apparatus, as an ultrasonic generator, nondestructive testing (NDT) apparatus as an ultrasonic probe, and the like in addition to the ultrasonic probe for medical diagnostic apparatus. The ultrasonic probe of the present invention is also applicable to an ultrasonic ink-jet apparatus as an ultrasonic generator by arranging ultrasonic transducers in an array and focusing ultrasonic waves from the respective transducers near the ink level to fly ink droplets.

EXAMPLES

The present invention will be described by way of examples.

Example 1

Table 1 shows the conditions for manufacturing single crystals and ultrasonic probes, and Table 2 shows the evaluation results of the single crystals and ultrasonic probes. Five samples were prepared for each sample number.

Chemically highly pure (99.9% or more) PbO, MgO, $Nb_2O_5$, and $TiO_2$ powders were prepared. 80 mol % PbO-20 mol % $B_2O_3$ was prepared as a flux. PbO, MgO, $Nb_2O_5$, and $TiO_2$ were mixed to have the following composition:

$$Pb\{(Mg_{1/3}Nb_{2/3})_{0.68}Ti_{O.32}\}O_3$$

This composition will be referred to as PMNT68/32 hereinafter. The PbO—$B_2O_3$ flux was added to the above powder mixture in an equimolar amount.

A single crystal was grown by the Bridgman method using the resultant powder mixture. The powder mixture was sufficiently mixed by a dry mixer and placed in a rubber bag. The mixture was pressed at a pressure of 2 ton/$cm^2$ to obtain a mass. A 1,000-g mass was placed in a platinum crucible having dimensions of 50 mm (diameter)×200 mm (height)×0.5 mm (thickness) and heated to 900° C. for 4 hours. The mass was temporarily melted to obtain a molten material. The molten material was cooled. Further, a 500-g mass was placed in the platinum crucible, and a lid was placed on the crucible. The crucible was then held at the center of an electric furnace. The crucible was heated to 1,220° C. over 12 hours, and then cooled to 800° C. at a cooling rate of 1° C./h while the crucible was moved downward at a rate of 0.3 mm/h. During cooling, oxygen was locally blown to one point at the lower portion of the platinum crucible to cause nucleation only at this point. The platinum crucible was then cooled to room temperature at a cooling rate of 50° C./h. The platinum crucible was then stripped off to obtain a single crystal. This single crystal had dimensions of about 50 mm×30 mm and a weight of about 500 g.

A portion of this single crystal was cut and pulverized to examine the crystal structure with X-ray diffraction. As a result, the single crystal had a perfect perovskite structure. The composition of this powder was analyzed by ICP (Inductive Coupling Plasma spectroscopy). The molar ratio of Ti was about 32.4 mol %; the single crystal had a composition which almost matched the desired composition.

The [001] direction was set using a Laue camera, and the single crystal was cut at a thickness of 0.5 to 1.5 mm in a direction parallel to the above axis to obtain about 40 wafers. Each wafer was cut into dimensions of 15 mm×10 mm, 15 mm×20 mm, or 15 mm×38 mm to obtain transducers. The surface of each transducer was polished with #4000 alumina powder to adjust the thickness to 0.2 to 0.8 mm. Ti/Au electrodes each having a thickness of 0.02 to 1.0 μm were formed on the upper and lower surfaces of each transducer by sputtering.

Some transducers underwent first poling, while the remaining transducers did not undergo first poling. The first poling was performed as follows. Each transducer was heated to 200° C. and then cooled to room temperature over three hours while an electric field of 0.1 to 2 kV/mm was kept applied to the transducer.

After the first poling, each single-crystal transducer was placed on a surface plate, and the thickness of the transducer was subtracted from the maximum height using a point micrometer to obtain warpage of the transducer. Each value was the average value of five samples. As shown in Table 2, as single crystals of sample numbers 1 to 10 did not undergo first poling or underwent in a very weak electric field, no warpage occurred in these single crystals or warpage was very small, if any.

Using a conductive paste, a common electrode plate was connected to the Ti/Au electrode formed on the upper surface (ultrasonic transmission surface) of the transducer. Similarly, using the conductive paste, a flexible printed circuit board was connected to the Ti/Au electrode formed on the lower surface of the transducer. An acoustic matching layer was formed on the ultrasonic transmission surface. Using an epoxy adhesive, the resultant structure was adhered to a backing material made of ferrite rubber which contains ferrite powders in the rubber.

After the transducer was adhered to the backing material, it was observed for cracking with the naked eye. The rate of cracked transducers among the five transducers was obtained. As shown in Table 2, no cracking occurred in the transducers of sample numbers 1 to 10 as warpage was small upon first poling in these transducers.

A dicer having a 50-μm thick diamond wheel blade was used to dice the acoustic matching layer, upper Ti/Au electrode, transducer, lower Ti/Au electrode, and a part of backing material at a pitch of 150 to 300 μm.

Some transducers underwent second poling, while the remaining transducers did not undergo the second poling. In the second poling, an electric field of 0.2 to 2.0 kV/mm was applied to each transducer within one minute while each transducer was kept in the temperature range of room temperature to 95° C. Cracking occurred in the transducers of sample number 19 during the second poling.

An acoustic lens was adhered to the upper surface of the acoustic matching layer. A coaxial cable having a capacitance of 100 pF/m and a length of 2 m was connected to the flexible printed circuit board. An array ultrasonic probe was thus manufactured.

In the resultant ultrasonic probe, the respective arrayed transducers were evaluated by measuring reflected echoes by the pulse echo method. Arrayed transducers each having an echo intensity lower than the average value by 20% or more were defined as failed channels. The rate of failed channels of all the channels was obtained. As shown in Table 2, in the transducers of sample numbers 1 to 10, the rate of failed channels was very low.

TABLE 1

PMNT 68/32

| No. | crystal orientation | thickness (mm) | dimension (mm × mm) | first poling conditions | dicing pitch (μm) | second poling conditions |
|---|---|---|---|---|---|---|
| 1- 1 | [100] | 0.2 | 15 × 10 | — | 150 | 25° C., 0.5 kV/mm |
| 1- 2 | [111] | 0.2 | 15 × 20 | 150° C., 0.5 kV/mm | 150 | 50° C., 0.5 kV/mm |
| 1- 3 | [100] | 0.2 | 15 × 20 | 170° C., 0.4 kV/mm | 150 | 25° C., 0.8 kV/mm |
| 1- 4 | [100] | 0.2 | 15 × 38 | — | 150 | 50° C., 0.5 kV/mm |
| 1- 5 | [100] | 0.4 | 15 × 10 | 200° C., 0.3 kV/mm | 250 | 50° C., 0.5 kV/mm |
| 1- 6 | [100] | 0.4 | 15 × 20 | — | 250 | 75° C., 0.8 kV/mm |
| 1- 7 | [111] | 0.4 | 15 × 20 | 150° C., 0.2 kV/mm | 250 | 50° C., 0.5 kV/mm |
| 1- 8 | [100] | 0.4 | 15 × 38 | 150° C., 0.2 kV/mm | 250 | 50° C., 0.5 kV/mm |
| 1- 9 | [100] | 0.6 | 15 × 20 | — | 300 | 50° C., 0.5 kV/mm |
| 1-10 | [100] | 0.6 | 15 × 38 | 220° C., 0.2 kV/mm | 300 | 25° C., 1.2 kV/mm |
| 1-11 | [100] | 0.2 | 15 × 10 | 150° C., 1.0 kV/mm | 150 | 50° C., 0.5 kV/mm |
| 1-12 | [111] | 0.2 | 15 × 20 | 220° C., 1.5 kV/mm | 150 | — |
| 1-13 | [100] | 0.2 | 15 × 20 | 100° C., 3.0 kV/mm | 150 | — |
| 1-14 | [100] | 0.2 | 15 × 38 | 50° C., 2.0 kV/mm | 150 | — |
| 1-15 | [100] | 0.4 | 15 × 10 | 150° C., 0.5 kV/mm | 250 | 95° C., 0.4 kV/mm |
| 1-16 | [100] | 0.4 | 15 × 20 | 200° C., 1.0 kV/mm | 250 | — |
| 1-17 | [111] | 0.4 | 15 × 20 | 200° C., 0.5 kV/mm | 250 | — |
| 1-18 | [100] | 0.4 | 15 × 38 | 200° C., 0.1 kV/mm | 250 | 25° C., 0.4 kV/mm |
| 1-19 | [100] | 0.6 | 15 × 20 | 250° C., 0.5 kV/mm | 300 | 50° C., 0.5 kV/mm |
| 1-20 | [100] | 0.8 | 15 × 38 | 150° C., 0.2 kV/mm | 300 | 50° C., 0.5 kV/mm |

TABLE 2

CHARACTERISTICS OF PMNT 68/32

| No. | warpage of transducer (mm) | rate of cracked transducer (%) | rate of failed channel (%) |
|---|---|---|---|
| 1-1 | 0 | 0 | 0 |
| 1-2 | 0.3 | 0 | 1 |
| 1-3 | 0.4 | 0 | 2 |
| 1-4 | 0 | 0 | 0 |
| 1-5 | 0.4 | 0 | 0 |
| 1-6 | 0 | 0 | 0 |
| 1-7 | 0.4 | 0 | 0 |
| 1-8 | 0.2 | 0 | 0 |

TABLE 2-continued

| CHARACTERISTICS OF PMNT 68/32 | | | |
|---|---|---|---|
| No. | warpage of transducer (mm) | rate of cracked transducer (%) | rate of failed channel (%) |
| 1-9 | 0.4 | 0 | 0 |
| 1-10 | 0 | 0 | 0 |
| 1-11 | 1.1 | 20 | 15 |
| 1-12 | 1.8 | 60 | 19 |
| 1-13 | 2.0 | 60 | 33 |
| 1-14 | 1.7 | 40 | 20 |
| 1-15 | 0.7 | 20 | 28 |

TABLE 2-continued

| CHARACTERISTICS OF PMNT 68/32 | | | |
|---|---|---|---|
| No. | warpage of transducer (mm) | rate of cracked transducer (%) | rate of failed channel (%) |
| 1-16 | 1.2 | 20 | 14 |
| 1-17 | 1.1 | 40 | 16 |
| 1-18 | 0.4 | 0 | 20 |
| 1-19 | 0.8 | 60* | 16 |
| 1-20 | 0.2 | 0 | 9 |

*Cracks are generated in the second poling step.

Example 2

Table 3 shows the conditions for manufacturing single crystals and ultrasonic probes, and Table 4 shows the evaluation results of the single crystals and ultrasonic probes. Five samples were prepared for each sample number.

Chemically highly pure (99.9% or more) PbO, $Sc_2O_3$, $Nb_2O_5$, $Ta_2O_5$, and $TiO_2$ powders were prepared. 75 mol % PbO-25 mol % $B_2O_3$ was prepared as a flux. PbO, $Sc_2O_3$, $Nb_2O_5$, $Ta_2O_5$, and $TiO_2$ were mixed to have the following composition:

$$Pb\{(Sc_{1/2}Nb_{1/2})_{0.27}(Sc_{1/2}Ta_{1/2})_{0.25}Ti_{0.48}\}O_3$$

This composition will be referred to as PSSNT27/25/48 hereinafter. The PbO—$B_2O_3$ flux was added to the above powder mixture in a double molar amount. A single crystal was manufactured under the same conditions as in Example 1 except the maximum melting temperature was 1,250° C. The composition of the single crystal, which was obtained by ICP analysis, was PSSNT29/27/44 slightly different from the charging composition. Ultrasonic probes were manufactured following the same procedures as in Example 1.

As can be apparent from Table 4, in the transducers of sample numbers 1 to 10, warpage was small, the rate of cracked transducers was low, and the rate of failed channels was also low.

TABLE 3

| PSSNT 29/27/44 | | | | | | |
|---|---|---|---|---|---|---|
| No. | crystal orientation | thickness (mm) | dimension (mm × mm) | first poling conditions | dicing pitch (μm) | second poling conditions |
| 2- 1 | [100] | 0.2 | 15 × 10 | — | 150 | 25° C., 0.5 kV/mm |
| 2- 2 | [111] | 0.2 | 15 × 20 | 150° C., 0.5 kV/mm | 150 | 50° C., 0.5 kV/mm |
| 2- 3 | [100] | 0.2 | 15 × 20 | 150° C., 0.4 kV/mm | 150 | 25° C., 0.8 kV/mm |
| 2- 4 | [100] | 0.2 | 15 × 38 | — | 150 | 50° C., 0.5 kV/mm |
| 2- 5 | [100] | 0.4 | 15 × 10 | 200° C., 0.3 kV/mm | 250 | 50° C., 0.5 kV/mm |
| 2- 6 | [100] | 0.4 | 15 × 20 | — | 250 | 75° C., 0.8 kV/mm |
| 2- 7 | [111] | 0.4 | 15 × 20 | 150° C., 0.2 kV/mm | 250 | 50° C., 0.5 kV/mm |
| 2- 8 | [100] | 0.4 | 15 × 38 | 150° C., 0.2 kV/mm | 250 | 50° C., 0.5 kV/mm |
| 2- 9 | [100] | 0.6 | 15 × 20 | — | 300 | 50° C., 0.5 kV/mm |
| 2-10 | [400] | 0.6 | 15 × 38 | 220° C., 0.2 kV/mm | 300 | 25° C., 1.2 kV/mm |
| 2-11 | [100] | 0.2 | 15 × 10 | 150° C., 1.0 kV/mm | 150 | 50° C., 0.5 kV/mm |
| 2-12 | [111] | 0.2 | 15 × 20 | 220° C., 1.5 kV/mm | 150 | — |
| 2-13 | [100] | 0.2 | 15 × 20 | 100° C.; 3.0 kV/mm | 150 | — |
| 2-14 | [100] | 0.2 | 15 × 38 | 50° C., 2.0 kV/mm | 150 | — |
| 2-15 | [100] | 0.4 | 15 × 10 | 150° C., 0.5 kV/mm | 250 | 95° C., 0.4 kV/mm |
| 2-16 | [100] | 0.4 | 15 × 20 | 200° C., 1.0 kV/mm | 250 | — |
| 2-17 | [111] | 0.4 | 15 × 20 | 200° C., 0.5 kV/mm | 250 | — |
| 2-18 | [100] | 0.4 | 15 × 38 | 200° C., 0.1 kV/mm | 250 | 25° C., 0.4 kV/mm |
| 2-19 | [100] | 0.6 | 15 × 20 | 250° C., 0.5 kV/mm | 300 | 50° C., 0.5 kV/mm |
| 2-20 | [100] | 0.8 | 15 × 38 | 150° C., 0.2 kV/mm | 300 | 50° C., 0.5 kV/mm |

TABLE 4

| CHARACTERISTICS OF PSSNT 29/27/44 | | | |
|---|---|---|---|
| No. | warpage of transducer (mm) | rate of cracked transducer (%) | rate of failed channel (%) |
| 2-1 | 0 | 0 | 0 |
| 2-2 | 0.3 | 0 | 1 |
| 2-3 | 0.3 | 0 | 1 |
| 2-4 | 0 | 0 | 0 |
| 2-5 | 0.3 | 0 | 0 |
| 2-6 | 0 | 0 | 0 |
| 2-7 | 0.2 | 0 | 0 |
| 2-8 | 0.3 | 0 | 0 |
| 2-9 | 0 | 0 | 0 |
| 2-10 | 0.2 | 0 | 0 |
| 2-11 | 1.0 | 20 | 10 |
| 2-12 | 1.4 | 40 | 12 |
| 2-13 | 2.1 | 60 | 25 |
| 2-14 | 1.5 | 40 | 19 |
| 2-15 | 0.5 | 20 | 28 |
| 2-16 | 1.1 | 40 | 12 |
| 2-17 | 1.1 | 40 | 11 |
| 2-18 | 0.3 | 0 | 17 |
| 2-19 | 0.6 | 60* | 14 |
| 2-20 | 0.2 | 0 | 8 |

*Cracks are generated in the second poling step.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing an ultrasonic probe, comprising the steps of:

adhering a piezoelectric single crystal made of a perovskite compound on a backing material;

dicing said piezoelectric single crystal in the form of an array to form a piezoelectric single-crystal transducer; and performing poling for said piezoelectric single-crystal transducer, wherein said piezoelectric single crystal is made of a complex perovskite compound represented by the following formula:

$$Pb\{(B1_{1/3}, B2_{2/3})_{1-x}Ti_x\}O_3$$

where $0<x\leqq 0.55$,

B1 is at least one element selected from the group consisting of Mg and Ni, and

B2 is at least one element selected from the group consisting of Nb and Ta.

2. The method according to claim 1, wherein said piezoelectric single crystal has a tickness of not more than 0.6 mm and an area of not less than 1.0 $cm^2$.

3. The method according to claim 1, wherein the step of performing poling comprises applying an electric field of 0.5 to 2 kV/mm to said piezoelectric single-crystal transducer.

4. The method according to claim 1, wherein the step of performing poling comprises heating said piezoelectric single-crystal transducer to a temperature of not more than 80° C.

5. The method according to claim 1, further comprising the step of performing first poling for said piezoelectric single crystal before said piezoelectric single crystal made of the perovskite compound is adhered to said backing material.

6. The method according to claim 5, wherein the step of performing first poling comprises applying an electric field of not more than 0.5 kV/mm to said piezoelectric single crystal.

7. The method according to claim 5, wherein the step of performing first poling comprises heating said piezoelectric single crystal to a temperature of not more than 250° C.

8. A method of manufacturing an ultrasonic probe, comprising the steps of:

adhering a piezoelectric single crystal made of a perovskite compound on a backing material;

dicing said piezoelectric single crystal in the form of an array to form a piezoelectric single-crystal transducer; and performing poling for said piezoelectric single-crystal transducer, wherein said piezoelectric single crystal is made of a complex perovskite compound represented by the following formula:

$$Pb\{(B1_{1/2}, B2_{1/2})_{1-x}Ti_x\}O_3$$

where $0<x\leqq 0.55$,

B1 is at least one element selected from the group consisting of In, Sc, and Yb, and

B2 is at least one element selected from the group consisting of Nb and Ta.

9. The method according to claim 8, wherein said piezoelectric single crystal has a thickness of not more than 0.6 mm and an area of not less than 1.0 $cm^2$.

10. The method according to claim 8, wherein the step of performing poling comprises applying an electric field of 0.5 to 2 kV/mm to said piezoelectric single-crystal transducer.

11. The method according to claim 8, wherein the step of performing poling comprises heating said piezoelectric single-crystal transducer to a temperature of not more than 80° C.

12. The method according to claim 8, further comprising the step of performing first poling for said piezoelectric single crystal before said piezoelectric single crystal made of the perovskite compound is adhered to said backing material.

13. The method according to claim 12, wherein the step of performing first poling comprises applying an electric field of not more than 0.5 kV/mm to said piezoelectric single crystal.

14. The method according to claim 12, wherein the step of performing first poling comprises heating said piezoelectric single crystal to a temperature of not more than 250° C.

15. A method of manufacturing an ultrasonic diagnostic apparatus comprising an ultrasonic probe, a transmitter/receiver and a signal processing unit connected to said ultrasonic probe, and a monitor for displaying a processed signal as an image, wherein said ultrasonic probe is formed by the steps of:

adhering a piezoelectric single crystal made of a perovskite compound on a support substrate;

dicing said piezoelectric single crystal in the form of an array to form a piezoelectric single-crystal transducer; and performing poling for said piezoelectric single-crystal transducer, wherein said piezoelectric single crystal is made of a complex perovskite compound represented by the following formula:

$$Pb\{(B1_{1/3}, B2_{2/3})_{1-x}Ti_x\}O_3$$

where $0<x\leqq 0.55$,

B1 is at least one element selected from the group consisting of Mg and Ni, and

B2 is at least one element selected from the group consisting of Nb and Ta.

16. The method according to claim 15, wherein said piezoelectric single crystal has a thickness of not more than 0.6 mm and an area of not less than 1.0 $cm^2$.

17. The method according to claim 15, wherein the step of performing poling comprises applying an electric field of 0.5 to 2 kV/mm to said piezoelectric single-crystal transducer.

18. The method according to claim 15, wherein the step of performing poling comprises heating said piezoelectric single-crystal transducer to a temperature of not more than 80° C.

19. The method according to claim 15, further comprising the step of performing first poling for said piezoelectric single crystal before said piezoelectric single crystal made of the perovskite compound is adhered to said support substrate.

20. The method according to claim 16, wherein the step of performing first poling comprises applying an electric field of not more than 0.5 kV/mm to said piezoelectric single crystal.

21. The method according to claim 16, wherein the step of performing first poling comprises heating said piezoelectric single crystal to a temperature of not more than 250° C.

22. A method of manufacturing an ultrasonic diagnostic apparatus comprising an ultrasonic probe, a transmitter/receiver and a signal processing unit connected to said ultrasonic probe, and a monitor for displaying a processed signal as an image, wherein said ultrasonic probe is formed by the steps of:

adhering a piezoelectric single crystal made of a perovskite compound on a support substrate;

dicing said piezoelectric single crystal in the form of an array to form a piezoelectric single-crystal transducer; and performing poling for said piezoelectric single-crystal transducer, wherein said piezoelectric single crystal is made of a complex perovskite compound represented by the following formula:

$$Pb\{(B1_{1/2}, B2_{1/2})_{1-x}Ti_x\}O_3$$

where $0<x\leqq 0.55$,

B1 is at least one element selected from the group consisting of In, Sc, and Yb, and

B2 is at least one element selected from the group consisting of Nb and Ta.

23. The method according to claim 22, wherein said piezoelectric single crystal has a thickness of not more than 0.6 mm and an area of not less than 1.0 $cm^2$.

24. The method according to claim 22, wherein the step of performing poling comprises applying an electric field of 0.5 to 2 kV/mm to said piezoelectric single-crystal transducer.

25. The method according to claim 22, wherein the step of performing poling comprises heating said piezoelectric single-crystal transducer to a temperature of not more than 80° C.

26. The method according to claim 22, further comprising the step of performing first poling for said piezoelectric single crystal before said piezoelectric single crystal made of the perovskite compound is adhered to said support substrate.

27. The method according to claim 26, wherein the step of performing first poling comprises applying an electric field of not more than 0.5 kV/mm to said piezoelectric single crystal.

28. The method according to claim 26, wherein the step of performing first poling comprises heating said piezoelectric single crystal to a temperature of not more than 250° C.

* * * * *